United States Patent
Saseendran

(10) Patent No.: US 10,418,274 B2
(45) Date of Patent: Sep. 17, 2019

(54) HIGH SPEED WAVEGUIDE INTEGRATED GE-BASED PHOTODIODE DESIGN FOR SILICON PHOTONICS

(71) Applicant: GLOBALFOUNDRIES Singapore Pte. Ltd., Singapore (SG)

(72) Inventor: Sandeep Seema Saseendran, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 28 days.

(21) Appl. No.: 15/657,894

(22) Filed: Jul. 24, 2017

(65) Prior Publication Data
US 2019/0027398 A1    Jan. 24, 2019

(51) Int. Cl.
*H01L 21/02* (2006.01)
*H01L 29/06* (2006.01)
*H01L 29/16* (2006.01)
*H01L 21/762* (2006.01)

(52) U.S. Cl.
CPC .. *H01L 21/76267* (2013.01); *H01L 21/02381* (2013.01); *H01L 21/76283* (2013.01); *H01L 29/0649* (2013.01); *H01L 29/0657* (2013.01); *H01L 29/16* (2013.01)

(58) Field of Classification Search
CPC ........... H01L 27/1211; H01L 21/76262; H01L 21/76278; H01L 33/002; H01L 33/28
See application file for complete search history.

(56) References Cited

U.S. PATENT DOCUMENTS

| | | | |
|---|---|---|---|
| 9,864,136 B1 * | 1/2018 | Jacob | G02B 6/12004 |
| 2009/0039361 A1 * | 2/2009 | Li | H01L 21/02381 |
| | | | 257/94 |
| 2015/0277072 A1 * | 10/2015 | Hatori | G02B 6/4207 |
| | | | 385/14 |

OTHER PUBLICATIONS

Das et al., "Groove Shape-Dependent Absorption Enhancement of 850 nm MSM Photodetectors with Nano-Gratings", Proceedings of 10th IEEE Conference on Nanotechnology, Aug. 17-20, 2010, 7 pages.
Halir et al., "Waveguide Sub-Wavelength Structures: A Review of Principles and Applications", Laser and Photonics Reviews, vol. 9, No. 1, Jan. 2015, pp. 25-49.
Gu et al., "Study of a Slow-Light-Enhanced Membrane Photodetector for Realizing On-Chip Interconnection With Low Power Consumption", Journal of the Optical Society of America B, vol. 34, No. 2, Feb. 2017, pp. 440-446.

(Continued)

*Primary Examiner* — Moazzam Hossain
*Assistant Examiner* — Stanetta D Isaac
(74) *Attorney, Agent, or Firm* — Ditthavong & Steiner, P.C.

(57) ABSTRACT

Methods of increasing the optical path length and bandwidth of a Ge-based photodiode while reducing the diode area and capacitance without compromising the optical responsivity and the resulting devices are provided. Embodiments include providing a Si substrate having a BOX layer over the Si substrate and a Si layer over the BOX layer; forming an oxide layer over the Si layer; forming a trench in the oxide layer, the trench having a center strip and a plurality of opposing fins; epitaxially growing Ge in the trench and above the oxide layer; and removing the oxide layer, a Ge center strip and a plurality of opposing fins remaining.

13 Claims, 6 Drawing Sheets

(56) References Cited

OTHER PUBLICATIONS

Mavrokefalos et al., "Efficient Light Trapping in Inverted Nanopyramid Thin Crystalline Silicon Membranes for Solar Cell Applications", Nano Letters, vol. 12, No. 6, May 21, 2012, pp. 2792-2796.
Gao et al., "Photon-Trapping Microstructures Enable High-Speed High-Efficiency Silicon Photodiodes", Nature Photonics, Apr. 3, 2017, 32 Pages.
Littlejohns et al., "Towards a Fully Functional Integrated Photonic-Electronic Platform via a Single SiGe Growth Step", Scientific Reports, vol. 6, Jan. 19, 2016, 6 Pages.

* cited by examiner

US 10,418,274 B2

HIGH SPEED WAVEGUIDE INTEGRATED GE-BASED PHOTODIODE DESIGN FOR SILICON PHOTONICS

TECHNICAL FIELD

The present disclosure relates to a method for fabricating a semiconductor device. The present disclosure is particularly applicable to integrated photonic semiconductor devices.

BACKGROUND

At present, germanium (Ge) based photodiodes are used for optical to electrical conversion of signals in silicon (Si) photonics due to its lower bandgap of 0.7 eV, making it an optimum choice for the communication wavelengths of 1310 nanometer (nm) and 1550 nm. Some of the key performance metrics of photodiodes are low reverse leakage current, high optical responsivity (i.e., absorbing light and generating a larger amount of photo current) and higher bandwidth (i.e., speed of the operation). However, a known approach towards attaining a high speed photodiode design is a compromise between bandwidth and optical responsivity. The diode area is reduced to improve the bandwidth, but such a reduction in area impacts the optical responsivity. Another approach is to reduce the thickness of Ge, but thinner absorber material absorbs less light thereby limiting responsivity.

A need therefore exists for methodology enabling formation of a Ge-based photodetector without compromising between bandwidth and optical responsivity.

SUMMARY

An aspect of the present disclosure is a method of increasing the optical path length and bandwidth of a Ge-based photodiode while reducing the area and capacitance without compromising optical responsivity.

Another aspect of the present disclosure is a Ge-based photodiode structure having a plurality of light trapping structures within a small diode area.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a Si substrate having a buried oxide (BOX) layer over the Si substrate and a Si layer over the BOX layer; forming an oxide layer over the Si layer; forming a trench in the oxide layer, the trench having a center strip and a plurality of opposing fins; epitaxially growing Ge in the trench and above the oxide layer; and removing the oxide layer, a Ge center strip and a plurality of opposing fins remaining.

Aspects of the present disclosure include forming an interlayer dielectric (ILD) over the Si layer and between the Ge fins; forming a silicon dioxide ($SiO_2$) layer over the ILD; and planarizing the $SiO_2$ layer down to the Ge. Further aspects include forming the trench through the oxide layer and a portion of the Si layer. Another aspect includes forming the Si layer to a thickness of 200 nm to 240 nm. Additional aspects include forming the oxide layer to a thickness of 0.07 micrometer (μm) to 0.09 μm. Further aspects include forming the oxide layer of deposited and grown oxides or nitride films. Additional aspects include forming the Ge center strip and the plurality of opposing fins to a thickness of 0.7 μm to 0.9 μm. Further aspects include forming the trench with the plurality of opposing fins having parallel sidewalls. Additional aspects include forming the trench with the plurality of opposing fins having sidewalls angled away from each other.

Another aspect of the present disclosure is a device including: a Si substrate; a BOX layer over the Si substrate; a Si layer over the BOX layer; and a Ge center strip and a plurality of opposing fins over portions of the Si layer.

Aspects of the device further include an ILD over the Si layer and on sidewalls of the plurality of Ge fins; and a $SiO_2$ over the ILD. Another aspect includes the Si layer has a thickness of 200 nm to 240 nm. Other aspects include the Ge center strip and the plurality of opposing fins having a thickness of 0.7 μm to 0.9 μm. A further aspect includes the center strip with the plurality of opposing fins being formed in a portion of the Si layer. Additional aspects include the sidewalls of adjacent Ge fins being parallel. A further aspect includes the sidewalls of adjacent Ge fins being angled towards each other or away from each other.

A further aspect of the present disclosure is a method including: providing a Si substrate having a BOX layer over the Si substrate and a Si layer over the BOX layer; forming an oxide layer to a thickness of 0.07 μm to 0.09 μm over the Si layer; patterning the oxide layer by photolithography to form a trench, the trench having a center strip and a plurality of opposing fins; epitaxially growing Ge in the trench and above the oxide layer to a thickness of 0.7 μm to 0.9 μm; and removing the oxide layer, a Ge center strip and a plurality of opposing fins remaining.

Aspects of the present disclosure include forming an ILD over the Si layer and between the Ge fins; forming a $SiO_2$ layer over the ILD; and planarizing the $SiO_2$ layer down to the Ge. Another aspect includes forming the trench through the oxide layer and a portion of the Si layer. A further aspect includes forming the trench with the plurality of opposing fins having parallel sidewalls.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of compromising between responsivity and bandwidth attendant upon forming a Ge-based photodiode. The problem is solved, inter alia, by forming a Ge-based photodiode having a plurality of light trapping structures within a small area, which increases the optical path length and bandwidth of the diode without compromising responsivity.

Methodology in accordance with embodiments of the present disclosure includes providing a Si substrate having a BOX layer over the Si substrate and a Si layer over the BOX layer. An oxide layer is formed over the Si layer. A trench is formed in the oxide layer, the trench having a center strip and a plurality of opposing fins. Ge is epitaxially grown in the trench and above the oxide layer and the oxide layer is removed, a Ge center strip and a plurality of opposing fins remaining.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
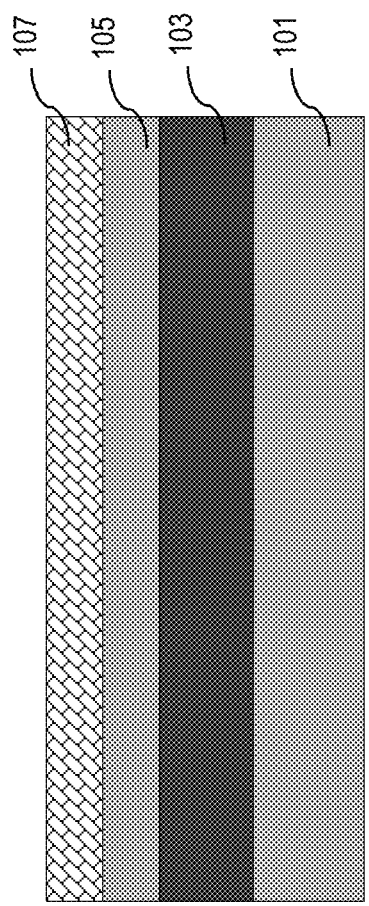
FIGS. 1 through 4 schematically illustrate cross-sectional views of a process flow for increasing the optical path length and bandwidth of a Ge-based photodiode while reducing the area and capacitance without compromising optical responsivity, in accordance with an exemplary embodiment.
Figure 2:
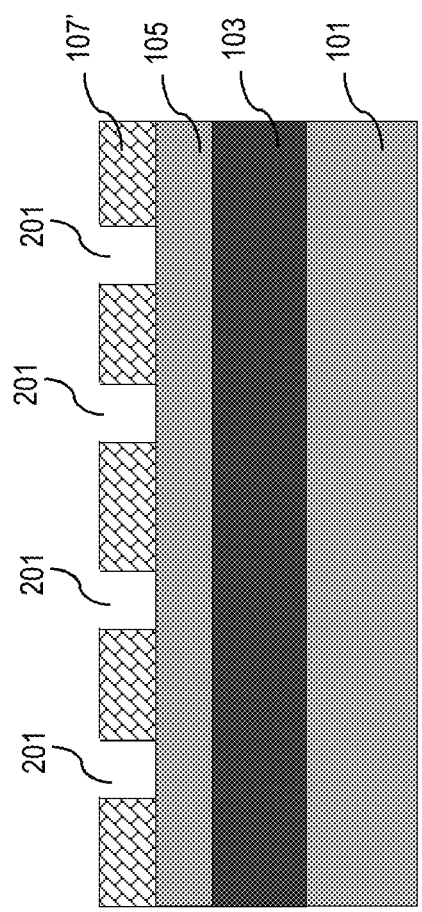
Figure 3:
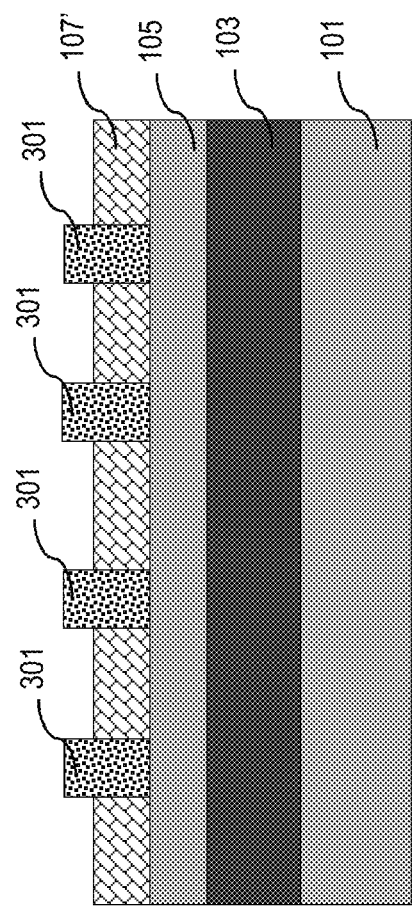
Figure 4:
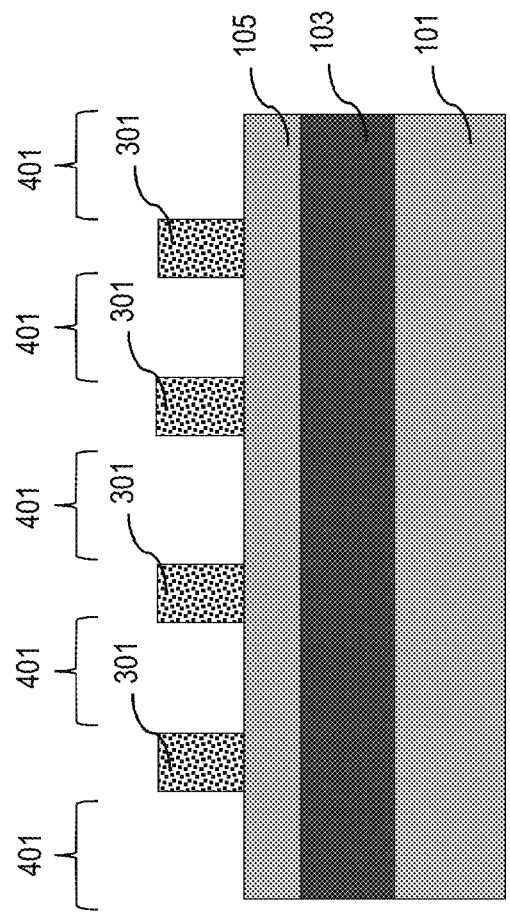

FIGS. 1 through 4 schematically illustrates cross-sectional views of a process flow for increasing the optical path length and bandwidth of a Ge-based photodiode while reducing the area and capacitance without compromising optical responsivity, in accordance with an exemplary embodiment. Adverting to FIG. 1, a Si substrate 101 is formed, e.g., to a thickness of 710 µm to 740 µm, having a BOX layer 103, e.g., to a thickness of 3 µm, over the Si substrate 101 and a Si layer 105 is formed, e.g., to a thickness of 200 nm to 240 nm, over the BOX layer 103. An oxide layer 107 is then formed, e.g., of deposited and grown oxides or nitride films, over the Si layer 105. The oxide layer 107 may be formed, e.g., to a thickness of 0.07 µm to 0.09 µm. As illustrated in FIG. 2, the oxide layer 107 is patterned by photolithography forming trenches 201, forming oxide layer 107'. Next, Ge is epitaxially grown in trenches 201 and above the oxide layer 107' forming Ge fins 301, as depicted in FIG. 3. The Ge fins 301 are formed, e.g., to a thickness of 0.7 µm to 0.9 µm. Adverting to FIG. 4, the oxide layer 107' is removed, forming a void 401 between each Ge fin 301. An ILD is formed, e.g., of SiO$_2$, (not shown for illustrative convenience) over the Si layer 105 sequentially in the void 401 and along the sidewalls of the Ge fins 301. Thereafter, the ILD is planarized down to the Ge fins 301 (not shown for illustrative convenience). In another instance, the oxide layer 107' is not removed and the ILD is formed over the oxide layer 107' (not shown for illustrative convenience).

Figure 5:
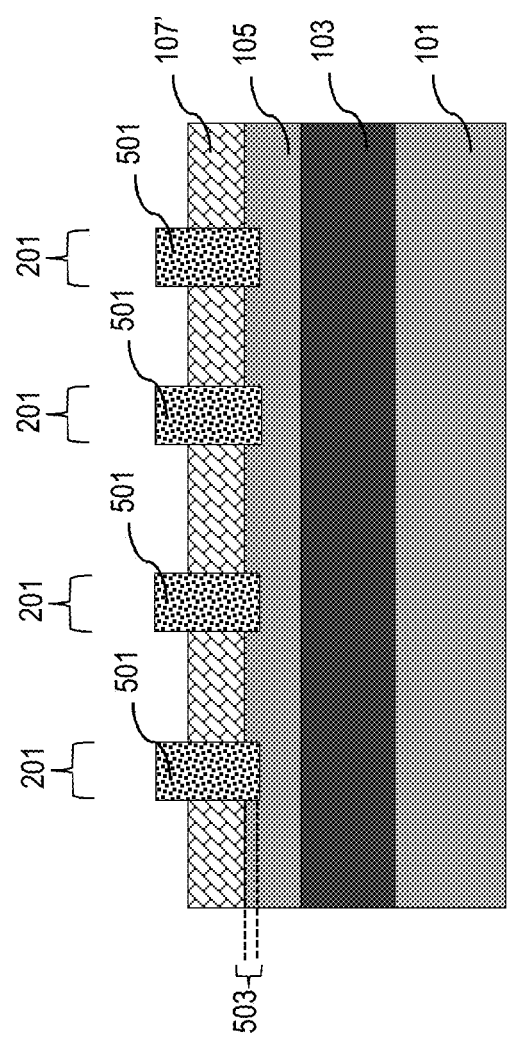
FIG. 5 schematically illustrates a cross-sectional view of the Ge-based photodiode of FIGS. 1 through 4, in accordance with another exemplary embodiment.

FIG. 5 schematically illustrates a cross-sectional view of the Ge-based photodiode of FIGS. 1 through 4, in accordance with another exemplary embodiment. The device of FIG. 5 is identical to the device of FIG. 3, except in this instance, when the oxide layer 107 of FIG. 2 is patterned by photolithography, forming trenches 201 and the oxide layer 107', the trenches 201 are formed through the oxide layer 107 and a portion of the Si layer 105. Thereafter, Ge is again epitaxially grown in the trenches 201 and above the oxide layer 107' forming the Ge fins 501. The depth of the Ge fins 501 is proportional to the patterning of the Si layer 105, as represented by lines 503.

Figure 6:
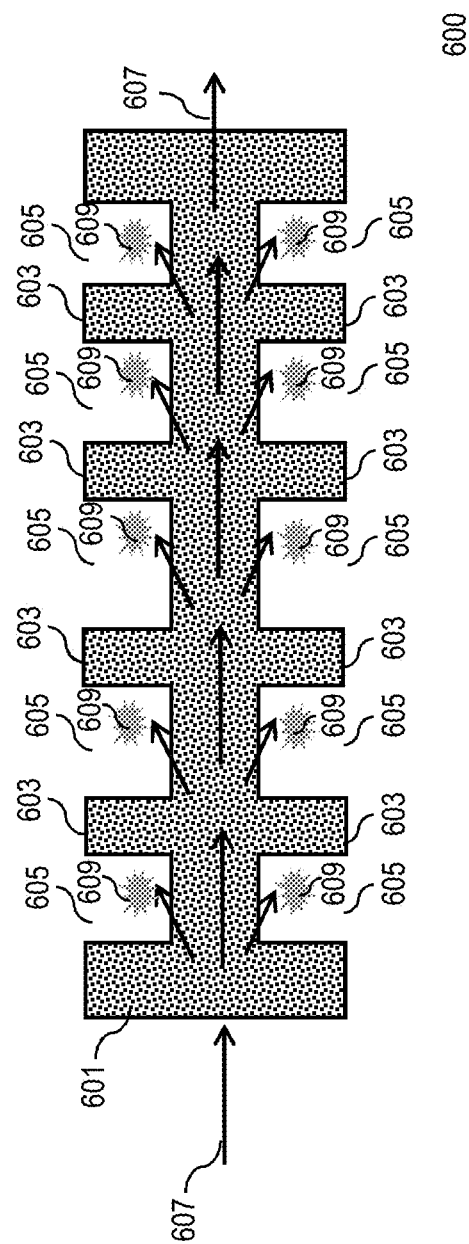
FIG. 6 schematically illustrates a top view of a photodiode layout, in accordance with an exemplary embodiment.

FIG. 6 schematically illustrates a top view of a photodiode layout, in accordance with an exemplary embodiment. FIG. 6 shows a photodiode 600 having a Ge center strip 601 with a plurality of fins 603 formed between a patterned oxide layer (not shown for illustrative convenience). The oxide layer is formed over the Si layer (not shown for illustrative convenience) and is patterned to grow the center strip 601 with a plurality of fins 603, e.g., having a lateral width of 0.2 µm to 1 µm between each of the plurality of fins 603. In this instance, there is a net reduction in the area of Ge, e.g., a 25% reduction, and a net reduction in capacitance, e.g., a 25% reduction, resulting in a net reduction in resistance-capacitance (RC) delay, e.g., a 25% reduction. In a further instance, light 607 passes through the photodiode 600 whereupon light 607 undergoes multiple reflections within the gap 605, i.e., light trapping structures, as depicted by the symbols 609. Consequently, the photodiode 600 has lower area and lower capacitance relative to known Ge-based photodiodes while yielding higher bandwidth. Further, the photodiode 600 provides similar optical responsivity relative to known Ge-based photodiodes with a higher speed of operation.

The embodiments of the present disclosure can achieve several technical effects including increasing the optical path length and bandwidth of a Ge-based photodiode while reducing the diode area and capacitance without compromising optical responsivity. In addition, this method can be implemented across all Si photonics processes for speed improvement in diodes. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of integrated photonic semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a silicon (Si) substrate having a buried oxide (BOX) layer over the Si substrate and a Si layer over the BOX layer;
   forming an oxide layer over the Si layer;
   forming a trench in the oxide layer, the trench having a center strip and a plurality of opposing fins;
   epitaxially growing germanium (Ge) in the trench and above the oxide layer; and
   removing the oxide layer, a Ge center strip and a plurality of opposing fins remaining, wherein, in top view, the Ge center strip extends between the plurality of opposing fins in perpendicular direction.

2. The method according to claim 1, further comprising:
   forming an interlayer dielectric (ILD) over the Si layer and between the Ge fins;
   forming a silicon dioxide ($SiO_2$) layer over the ILD; and
   planarizing the $SiO_2$ layer down to the Ge.

3. The method according to claim 1, further comprising:
   forming the trench through the oxide layer and a portion of the Si layer.

4. The method according to claim 1, comprising forming the Si layer to a thickness of 200 nanometer (nm) to 240 nm.

5. The method according to claim 1, comprising forming the oxide layer to a thickness of 0.07 micrometer ($\mu m$) to 0.09 $\mu m$.

6. The method according to claim 1, comprising forming the oxide layer of deposited and grown oxides or nitride films.

7. The method according to claim 1, comprising forming the Ge center strip and the plurality of opposing fins to a thickness of 0.7 $\mu m$ to 0.9 $\mu m$.

8. The method according to claim 1, comprising forming the trench with the plurality of opposing fins having parallel sidewalls.

9. The method according to claim 1, comprising forming the trench with the plurality of opposing fins having sidewalls angled away from each other.

10. A method comprising:
    providing a silicon (Si) substrate having a buried oxide (BOX) layer over the Si substrate and a Si layer over the BOX layer;
    forming an oxide layer to a thickness of 0.07 $\mu m$ to 0.09 $\mu m$ over the Si layer;
    patterning the oxide layer by photolithography to form a trench, the trench having a center strip and a plurality of opposing fins;
    epitaxially growing germanium (Ge) in the trench and above the oxide layer to a thickness of 0.7 $\mu m$ to 0.9 $\mu m$; and
    removing the oxide layer, a Ge center strip and a plurality of opposing fins remaining,
    wherein, in top view, the Ge center strip extends between the plurality of opposing fins in perpendicular direction.

11. The method according to claim 10, further comprising:
    forming an interlayer dielectric (ILD) over the Si layer and between the Ge fins;
    forming a silicon dioxide ($SiO_2$) layer over the ILD; and
    planarizing the $SiO_2$ layer down to the Ge.

12. The method according to claim 10, further comprising:
    forming the trench through the oxide layer and a portion of the Si layer.

13. The method of claim 10, comprising forming the trench with the plurality of opposing fins having parallel sidewalls.

* * * * *